(12) United States Patent
Moll et al.

(10) Patent No.: US 10,115,621 B2
(45) Date of Patent: Oct. 30, 2018

(54) METHOD FOR IN-DIE OVERLAY CONTROL USING FEOL DUMMY FILL LAYER

(71) Applicant: GLOBALFOUNDRIES Inc., Grand Cayman (KY)

(72) Inventors: Peter Moll, Dresden (DE); Martin Schmidt, Moritzburg (DE); Carsten Hartig, Meerane (DE); Matthias Ruhm, Dresden (DE); Stefan Thierbach, Dresden (DE); Stefan Rongen, Radeburg (DE); Daniel Fischer, Dresden (DE); Andreas Schuring, Dresden (DE); Guido Überreiter, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 111 days.

(21) Appl. No.: 15/153,936

(22) Filed: May 13, 2016

(65) Prior Publication Data

US 2017/0330782 A1 Nov. 16, 2017

(51) Int. Cl.
| | |
|---|---|
| *H01L 21/68* | (2006.01) |
| *H01L 23/544* | (2006.01) |
| *G03F 7/20* | (2006.01) |
| *G03F 9/00* | (2006.01) |
| *H01L 21/66* | (2006.01) |

(52) U.S. Cl.
CPC ............ *H01L 21/682* (2013.01); *G03F 7/70* (2013.01); *G03F 7/70633* (2013.01); *G03F 9/70* (2013.01);
(Continued)

(58) Field of Classification Search
CPC .... G03F 7/70; G03F 7/70633; G03F 7/70775; G03F 9/70; G03F 9/7003; G03F 9/7073;
(Continued)

(56) References Cited

U.S. PATENT DOCUMENTS

| | | | | |
|---|---|---|---|---|
| 5,308,682 A | * | 5/1994 | Morikawa | ............. H01L 23/544 257/797 |
| 6,239,031 B1 | * | 5/2001 | Kepler | ..................... G03F 9/70 257/E23.179 |

(Continued)

FOREIGN PATENT DOCUMENTS

| | | |
|---|---|---|
| CN | 1534271 A | 10/2004 |
| TW | 201506554 A | 2/2015 |
| TW | 201600828 A | 1/2016 |

OTHER PUBLICATIONS

Office Action for the related Taiwanese Patent Application No. 106104726, dated Feb. 22, 2018, 16 pages.

*Primary Examiner* — Eduardo A Rodela
(74) *Attorney, Agent, or Firm* — Ditthavong & Steiner, P.C.

(57) ABSTRACT

Methods for in-die overlay reticle measurement and the resulting devices are disclosed. Embodiments include providing parallel structures in a first layer on a substrate; determining measurement sites, in a second layer above the first layer, void of active integrated circuit elements; forming overlay trenches, in the measurement sites and parallel to the structures, exposing sections of the structures, wherein each overlay trench is aligned over a structure and over spaces between the structure and adjacent structures; determining a trench center-of-gravity of an overlay trench; determining a structure center-of-gravity of a structure exposed in the overlay trench; and determining an overlay parameter based on a difference between the trench center-of-gravity and the structure center-of-gravity.

11 Claims, 5 Drawing Sheets

(52) U.S. Cl.
CPC ............ *G03F 9/7003* (2013.01); *G03F 9/708* (2013.01); *G03F 9/7073* (2013.01); *H01L 21/68* (2013.01); *H01L 22/34* (2013.01); *H01L 23/544* (2013.01); *H01L 2223/54426* (2013.01)

(58) Field of Classification Search
CPC ...... G03F 9/7076; G03F 9/708; G03F 9/7084; G03F 9/7088; H01L 21/027; H01L 21/68; H01L 21/682; H01L 22/34; H01L 23/544
See application file for complete search history.

(56) References Cited

U.S. PATENT DOCUMENTS

| | | | | |
|---|---|---|---|---|
| 6,391,737 | B1* | 5/2002 | Ku | H01L 21/76229 257/797 |
| 6,603,163 | B2* | 8/2003 | Hori | H01L 27/0805 257/296 |
| 6,759,112 | B2* | 7/2004 | Wong | H01L 22/20 216/19 |
| 7,411,294 | B2* | 8/2008 | Nakano | H05K 1/0269 257/48 |
| 2005/0031995 | A1* | 2/2005 | Kang | G03F 7/70633 430/311 |
| 2006/0060945 | A1* | 3/2006 | Cho | H01L 23/544 257/622 |
| 2010/0333052 | A1* | 12/2010 | Tsuchiya | G03F 7/70633 716/106 |
| 2012/0135341 | A1* | 5/2012 | Tseng | G03F 1/38 430/5 |
| 2014/0353598 | A1* | 12/2014 | Jeong | H01L 51/0002 257/40 |
| 2015/0221565 | A1 | 8/2015 | Ning et al. | |
| 2016/0246172 | A1* | 8/2016 | deVilliers | G03F 7/70466 |
| 2016/0377425 | A1* | 12/2016 | Gupta | H01J 37/222 250/307 |

* cited by examiner

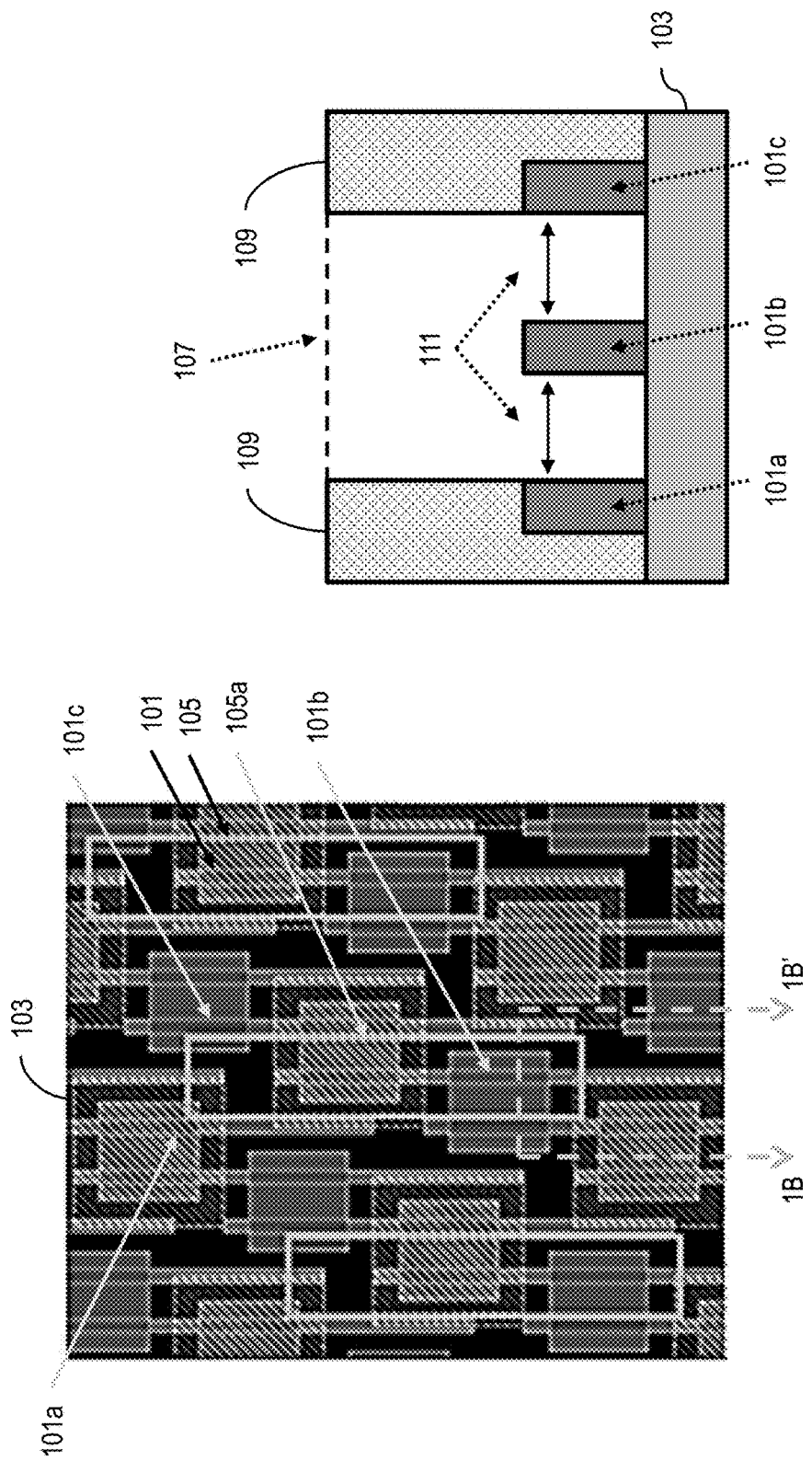

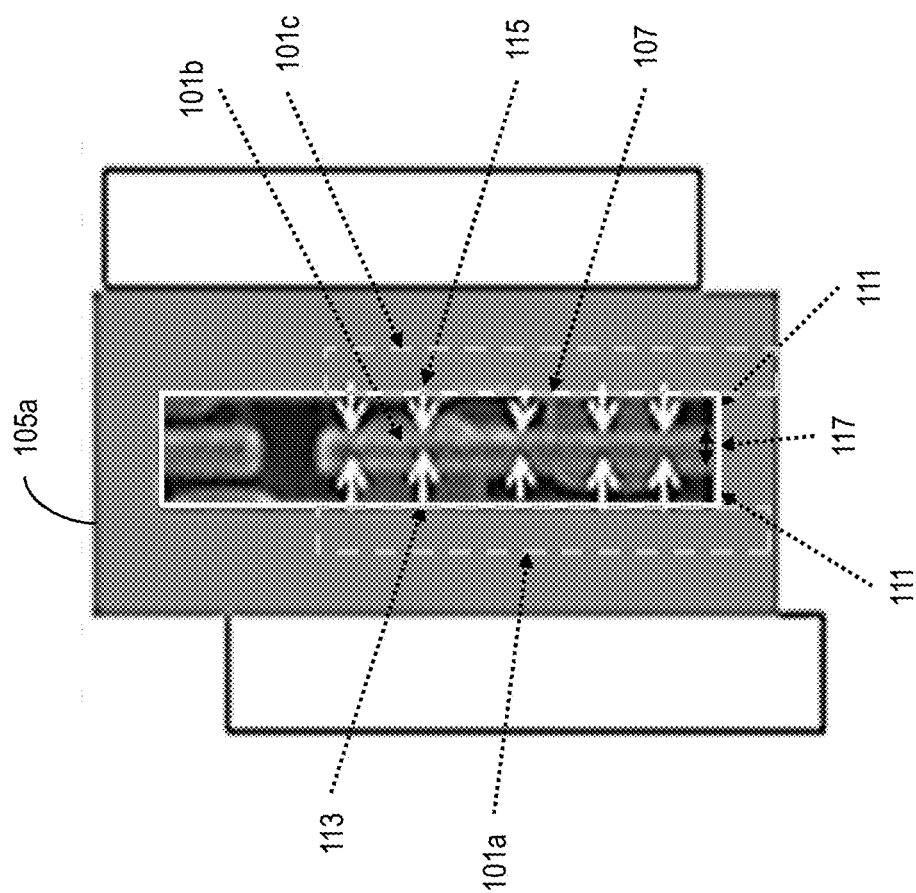

METHOD FOR IN-DIE OVERLAY CONTROL USING FEOL DUMMY FILL LAYER

TECHNICAL FIELD

The present disclosure relates generally to designing and fabricating integrated circuit (IC) devices. The present disclosure is particularly applicable to in-die overlay reticle measurement particularly for the 45 nanometer (nm) technology node and beyond.

BACKGROUND

With advancements in IC scaling with smaller technology nodes, defect detection and overlay metrology are becoming more challenging. Standard optical overlay (OVL) structures are large (e.g. in micrometers) and require placement in large spaces of frame or in reserved blank spaces within the chip/die area. An alternative to using the standard optical method may be to use a critical dimension scanning electron microscope (CDSEM). However, use of the CDSEM requires compatible dimensions and appearance of the structures on a reference layer that can be exposed and dimensions of the underlying layer can be assessed. Such evaluations are particularly problematic for interconnects due to limited visibility of buried layers.

Therefore, a need exists for methodology enabling in-die overlay reticle measurement and the resulting devices.

SUMMARY

An aspect of the present disclosure is a method for in-die overlay reticle measurement.

Another aspect of the present disclosure is a device including structures enabling in-die overlay reticle measurement.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing parallel structures in a first layer on a substrate; determining measurement sites, in a second layer above the first layer, void of active integrated circuit elements; forming overlay trenches, in the measurement sites and parallel to the structures, exposing sections of the structures, wherein each overlay trench is aligned over a structure and over spaces between the structure and adjacent structures; determining a trench center-of-gravity of an overlay trench; determining a structure center-of-gravity of a structure exposed in the overlay trench; and determining an overlay parameter based on a difference between the trench center-of-gravity and the structure center-of-gravity.

In one aspect, determining the trench center-of-gravity includes measuring a first distance from a first edge of the overlay trench to the structure; and measuring a second distance from a second edge, opposing the first edge, of the overlay trench to the structure.

Another aspect includes calculating averages of first and second distances based on multiple measurements of the first and second distances along a longer axis of the first and second edges of the overlay trench; and determining the trench center-of-gravity based on the averages.

In another aspect, determining the structure center-of-gravity includes measuring a width of the structure across a shorter axis of the structure.

A further aspect includes calculating an average width of multiple width measurements of the structure along a longer axis of the structure.

One aspect includes determining the overlay parameter based on a difference between the averages of first and second distances and the average width.

In another aspect, the first layer is an active polysilicon layer and the second layer is a contact layer. In a further aspect, the structures are dummy gates.

An additional aspect includes measuring the first and second distances and the width with a critical dimension scanning electron microscope (CDSEM).

In one aspect, at least six structures in a measurement site are aligned along a vertical axis.

In a further aspect, at least six structures in a measurement site are aligned in a staggered manner.

In another aspect, at least six structures in a measurement site are aligned in two equal side-by-side sets, in which the structures in each set are aligned along a diagonal.

Another aspect of the present disclosure includes a device including: parallel structures in a first layer on a substrate; measurement sites, in a second layer above the first layer, void of active integrated circuit elements; and overlay trenches, in the measurement sites and parallel to the structures, exposing sections of the structures, wherein each overlay trench is aligned over a structure and over spaces between the structure and adjacent structures, wherein an overlay parameter is based on a difference between a trench center-of-gravity and a structure center-of-gravity.

In a further aspect, the trench center-of-gravity is at a first distance from a first edge of the overlay trench to the structure and a second distance from a second edge, opposing the first edge, of the overlay trench to the structure.

In one aspect, the structure center-of-gravity is a width of the structure.

In another aspect, the first layer is a polysilicon layer, the second layer is a contact layer, and the structures are dummy gates.

In an additional aspect, at least six structures in a measurement site are aligned along a vertical axis.

In one aspect, at least six structures in a measurement site are aligned in a staggered manner.

In a further aspect, at least six structures in a measurement site are aligned in two equal side-by-side sets, in which the structures in each set are aligned along a diagonal.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 1A illustrates a top view of an IC layout including IC structures and overlay trenches, and FIG. 1B illustrates a cross-sectional view of IC structures and an overlay structure, in accordance with an exemplary embodiment;

FIG. 1C illustrates a top view of a structure exposed in an overlay trench, in accordance with an exemplary embodiment.

DETAILED DESCRIPTION

Figure 1E:
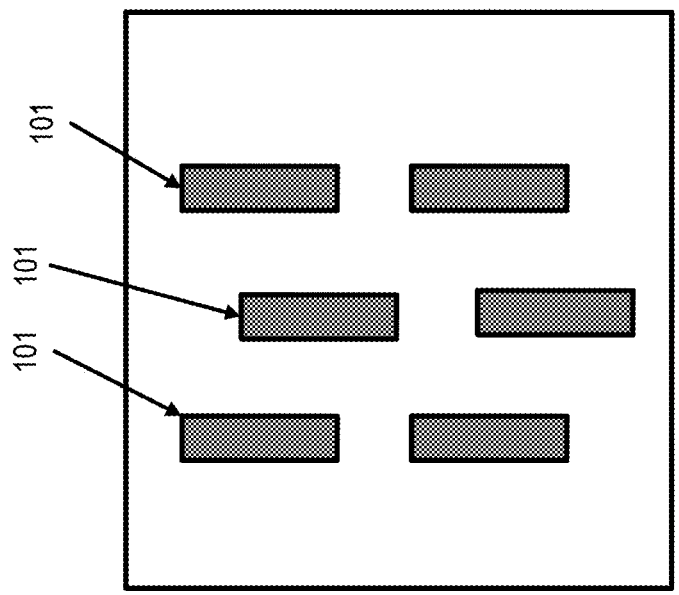
FIGS. 1E, 1G, and 1I illustrate different ways of grouping structures 101 for measurement sites associated with formations in FIGS. 1D, 1F, and 1H, respectively, in accordance with an exemplary embodiment.

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in a block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problem of overlay structures having a large size and requiring big open areas in the frame or dedicated chip area attendant upon utilizing standard optical overlay structures for in-die measurement of overlay parameters. The present disclosure addresses and solves such problems, for instance, by, inter alia, forming overlay trenches in an upper layer to expose existing IC structures in an adjacent lower layer for in-die measurement of alignment accuracy of the adjacent layers.

FIG. 1A illustrates parallel structures 101 (e.g., 101a, 101b, 101c) in a first layer 103 of a substrate. An algorithm may be utilized to determine measurement sites 105, in a second layer (not shown for illustration convenience) above the first layer 103, wherein the structures 101 are in an area of the substrate void of active IC elements such as active devices or metal-1 routing. Conditions for an appropriate measurement site include a safety distance of 2 microns (μm) to functional structures in the second layer, a safety distance of 0.5 μm to functional structures in the active layer, polysilicon layer, metal-1, and metal 2 layers, and a minimal number of six adjacent suitable structures 101 at the site. The measurement sites 105 are parallel to the structures 101. The cross-sectional line 1B-1B' is utilized to illustrate a cross-sectional view including structures 101a, 101b, and 101c, and measurement site 105a. The first layer 103 may, for example, be a polysilicon layer and the structures 101 may be dummy gates used for a dummy fill.

FIG. 1B illustrates a cross-sectional view including an overlay trench 107 that is formed in a second layer 109 (e.g. an interlayer dielectric (ILD)) at a measurement site (e.g. 105a) to expose sections of the structures 101 (e.g. 101b). The overlay trench 107 is aligned over a structure 101b and over spaces 111 between the structure 101b and adjacent structures 101a and 101c. For the example in which the first layer 103 is a polysilicon layer, the second layer 109 may be a contact layer. The overlay trench 107 may be a contact structure having dimensions, for instance, of 200×900 nm.

FIG. 1C illustrates a top of view of the overlay trench 107 aligned over the structure 101b and over the spaces 111 between the structure 101b and adjacent structures 101a and 101c (under second layer 109). One or more metrology techniques (e.g. critical dimension scanning electron microscope (CDSEM)) may be utilized to measure a trench center-of-gravity of the overlay trench 107, for example, by measuring a first distance 113 from a first edge of the overlay trench 107 to the structure 101b and measuring a second distance 115 from a second edge, opposing the first edge, of the overlay trench opening 107 to the structure 101b. One or more metrology techniques may be utilized to determine a structure center-of-gravity of the structure 101b exposed in the overlay trench 105a. For example, the structure center-of-gravity of the structure 101b may be determined by measuring a width of the structure 101b across a shorter axis 117 and then calculating a mid-point of the width measurement. For better accuracy, an average width based on multiple width measurements of the structure 101b may be calculated along a longer axis of the structure 101b. The number of measurements should be at least five, e.g. 20 to 30.

A difference between the trench center-of-gravity and the structure center-of-gravity may be calculated to determine an overlay value indicating an overlay offset between the first and second layers.

Averages of the first and the second distances 113, and 115, respectively, may be calculated, for example, by performing multiple measurements of the first and second distances along a longer axis of the first and second edges of the overlay trench 107. Further, the trench center-of-gravity may be based on the averages of the first and the second distances. Like for the structure center of gravity, the number of measurements should be at least five, e.g. 20 to 30.

The overlay parameter may be based on a difference between the averages of first and second distances and the average width.

Figure 1D:
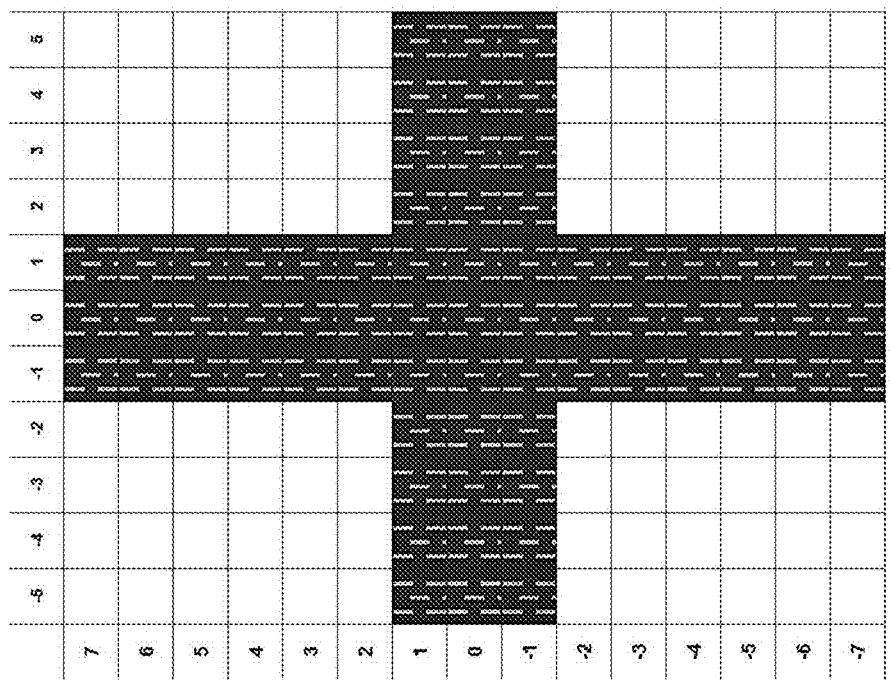
FIGS. 1D, 1F and 1H illustrate different possible formations of structures 101.
Figure 1G:
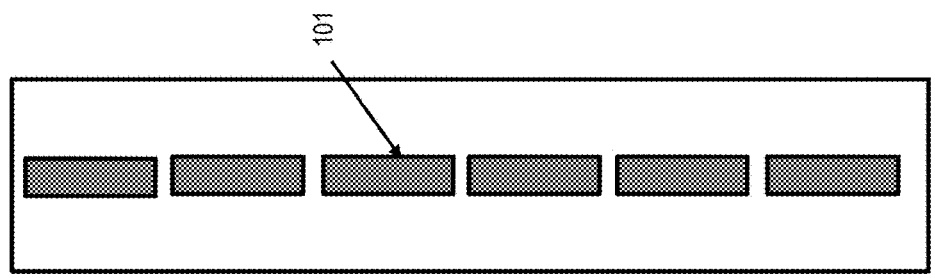
Figure 1F:
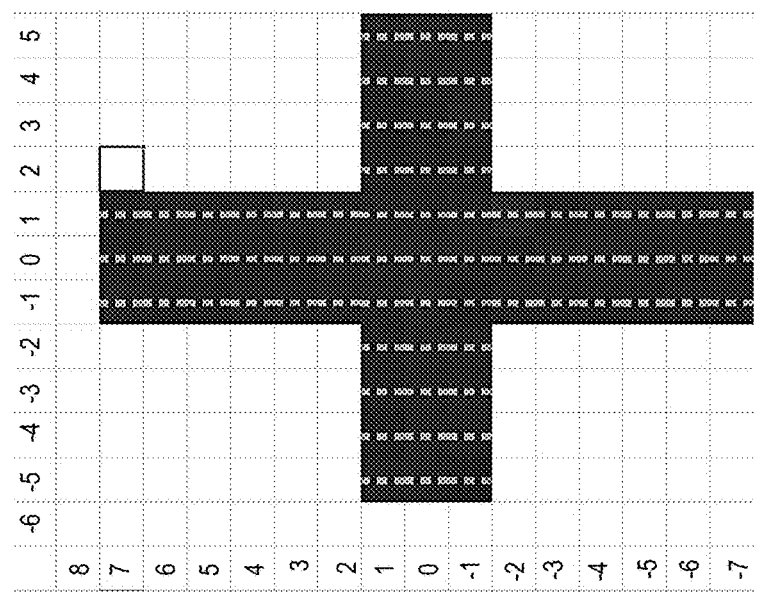
Figure 1I:
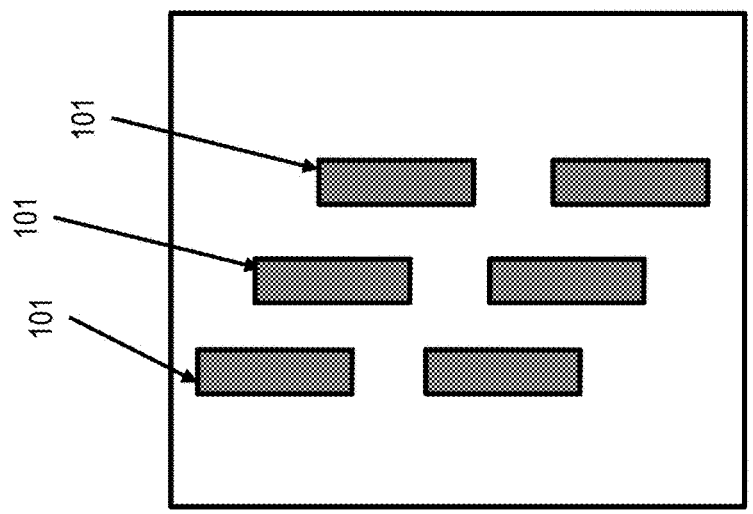
Figure 1H:
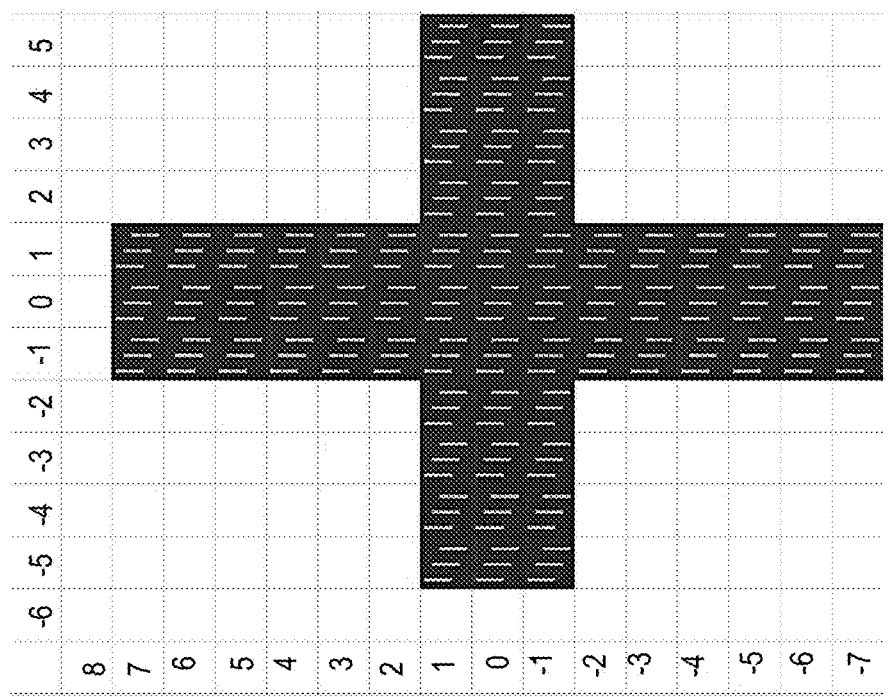

FIGS. 1D, 1F and 1H illustrate different possible formations of structures 101. FIGS. 1E, 1G, and 1I illustrate different ways of grouping structures 101 for measurement sites associated with formations in FIGS. 1D, 1F, and 1H, respectively. As illustrated, each measurement site must include at least six structures 101.

It is noted that the methods discussed above may be utilized for in-die measurements of other layers and structures in an IC device, for example, vias and a metal overlay, a metal layer (e.g. a first metal layer, M1) and a contact layer and other similar structures and related layers.

The embodiments of the present disclosure can achieve several technical effects including more granular in-die measurement of overlay parameters with a smaller layout area and without a need to redesign front-end-of-line (FEOL) layers, an upgrading of an existing reticle with only one new reticle, and quick and more accurate feedback of measurement results reducing or eliminating defective wafers. In addition, whereas the prior art normally has 10 to 20 dedicated sites, the number of possible measurement sites in accordance with the present disclosure may be in excess of 1000. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing parallel structures in a first layer on a substrate;
determining measurement sites, in a second layer above the first layer, void of active integrated circuit elements;
forming overlay trenches with a first reticle, in the measurement sites and parallel to the structures, exposing sections of the structures, wherein each overlay trench is aligned over a structure and over spaces between the structure and adjacent structures;
determining a trench center-of-gravity of an overlay trench by measuring a first distance from a first edge of the overlay trench to the structure with a critical dimension scanning electron microscope (CDSEM); and measuring a second distance from a second edge, opposing the first edge, of the overlay trench to the structure with the CDSEM;
determining a structure center-of-gravity of a structure exposed in the overlay trench;
determining an overlay parameter based on a difference between the trench center-of-gravity and the structure center-of-gravity; and
upgrading the first reticle with a second reticle.

2. The method according to claim 1, comprising:
calculating averages of first and second distances based on multiple measurements of the first and second distances along a longer axis of the first and second edges of the overlay trench; and
determining the trench center-of-gravity based on the averages.

3. The method according to claim 2, wherein determining the structure center-of-gravity comprises:
measuring a width of the structure across a shorter axis of the structure.

4. The method according to claim 3, comprising:
calculating an average width of multiple width measurements of the structure along a longer axis of the structure.

5. The method according to claim 4, comprising:
determining the overlay parameter based on a difference between the averages of first and second distances and the average width.

6. The method according to claim 1, wherein the first layer is an active polysilicon layer and the second layer is a contact layer.

7. The method according to claim 6, wherein the structures are dummy gates.

8. The method according to claim 1, wherein at least six structures in a measurement site are aligned along a y axis.

9. The method according to claim 8, wherein at least six structures in a measurement site are aligned in two equal side-by-side sets, in which the structures in each set are aligned along a diagonal.

10. The method according to claim 1, wherein at least six structures in a measurement site are aligned in a staggered manner.

11. A method comprising:
providing parallel structures in a first layer on a substrate;
determining measurement sites based on a minimum of six adjacent parallel structures having a predetermined distance between the parallel structures and functional structures in other layers, in a second layer above the first layer, void of active integrated circuit elements;
forming overlay trenches with a first reticle, in the measurement sites and parallel to the structures, exposing sections of the structures, wherein each overlay trench is aligned over a structure and over spaces between the structure and adjacent structures;
measuring, with a critical dimension scanning electron microscope (CDSEM), a first distance from a first edge of an overlay trench to the structure, and a second distance from a second edge, opposing the first edge, of the overlay trench to the structure;
calculating averages of first and second distances based on multiple measurements of the first and second distances along a longer axis of the first and second edges of the overlay trench;
determining a trench center-of-gravity of the overlay trench based on the first and second distances or based on the averages;
measuring a width of the structure across a shorter axis of the structure;
calculating an average width of multiple width measurements of the structure along a longer axis of the structure;
determining a structure center-of-gravity of a structure exposed in the overlay trench based on a width of the structure across a shorter axis of the structure;
calculating an average width of multiple width measurements of the structure along a longer axis of the structure;
determining an overlay parameter based on a difference between the trench center-of-gravity and the structure center-of-gravity or based on a difference between the averages of first and second distances and the average width; and
upgrading the first reticle with a second reticle.

* * * * *